United States Patent
Zhang

(10) Patent No.: US 10,498,135 B2
(45) Date of Patent: Dec. 3, 2019

(54) SWITCH PROTECTION DEVICE

(71) Applicant: Contemporary Amperex Technology Co., Limited, Ningde, Fujian (CN)

(72) Inventor: Di Zhang, Ningde (CN)

(73) Assignee: Contemporary Amperex Technology Co., Limited, Ningde (CN)

( * ) Notice: Subject to any disclaimer, the term of this patent is extended or adjusted under 35 U.S.C. 154(b) by 65 days.

(21) Appl. No.: 15/892,716

(22) Filed: Feb. 9, 2018

(65) Prior Publication Data
US 2018/0241201 A1   Aug. 23, 2018

(30) Foreign Application Priority Data

Feb. 22, 2017   (CN) .................... 2017 2 0160512 U

(51) Int. Cl.
| | |
|---|---|
| *H02H 9/00* | (2006.01) |
| *H03K 17/56* | (2006.01) |
| *H02J 7/00* | (2006.01) |
| *H04L 12/28* | (2006.01) |

(52) U.S. Cl.
CPC ............ *H02H 9/001* (2013.01); *H03K 17/56* (2013.01); *H02J 7/0026* (2013.01); *H04L 12/28* (2013.01)

(58) Field of Classification Search
CPC .......... H02H 9/00; H03K 17/00; H04L 12/00; H02J 7/00
USPC ....................................................... 307/113
See application file for complete search history.

(56) References Cited

U.S. PATENT DOCUMENTS

| | | |
|---|---|---|
| 2013/0229068 A1 | 9/2013 | Sanders, III et al. |
| 2015/0029621 A1* | 1/2015 | Giannoccaro ............ H02J 3/36 361/54 |

FOREIGN PATENT DOCUMENTS

| | | | |
|---|---|---|---|
| WO | 2016/173619 A1 | 11/2016 | |
| WO | WO-2016173619 A1 * | 11/2016 | ........... G01R 31/327 |

OTHER PUBLICATIONS

Extended European Search Report for European Application No. 18156429.5, dated Jul. 18, 2018.

* cited by examiner

*Primary Examiner* — Rexford N Barnie
*Assistant Examiner* — Joseph N Inge
(74) *Attorney, Agent, or Firm* — Law Offices of Liaoteng Wang

(57) ABSTRACT

The present disclosure provides a protective device related to the field of battery technology. The protective device includes an electronic switch, a mechanical switch and a time logic circuit. A first output terminal of the time logic circuit is connected to the electronic switch; a second output terminal of the time logic circuit is connected to the mechanical switch; an input terminal of the time logic circuit is connected to an output terminal of a power supply; and the electronic switch is connected in series with the mechanical switch into a circuit under control. The protective device provided in the present disclosure can effectively reduce the damage of the mechanical switch and extend the service life of the mechanical switch.

6 Claims, 2 Drawing Sheets

SWITCH PROTECTION DEVICE

CROSS-REFERENCE TO RELATED APPLICATION

This application is based upon and claims priority to Chinese Patent Application No. 201720160512.3, filed on Feb. 22, 2017, the content of which is incorporated herein by reference in its entirety.

TECHNICAL FIELD

The present disclosure relates to the field of battery technology, and particularly relates to a protective device.

BACKGROUND

Mechanical switches including replays, contactors and the like are widely used in circuits. Since some mechanical switches (e.g. a relay) have advantages of being small in size and enabling electrical isolation, the relay can be used in a battery management system to control charging and discharging of a battery. At the moment the relay is turned on, an inrush current may be generated in the circuit to cause contact ablation; or at the moment the relay is turned off, an electric arc may be generated to cause contact ablation. The inrush current at the moment the relay is turned on and the electric arc at the moment the relay is turned off are unavoidable. The contact ablation in the relay may lead to an increased contact resistance of the relay, resulting in an increased amount of heat produced at the use of the relay and a reduced serve life of the relay.

SUMMARY

The present disclosure provides a protective device including an electronic switch, a mechanical switch and a time logic circuit, wherein a first output terminal of the time logic circuit is connected to the electronic switch; a second output terminal of the time logic circuit is connected to the mechanical switch; an input terminal of the time logic circuit is connected to an output terminal of a power supply; and the electronic switch is connected in series with the mechanical switch into a circuit under control.

BRIEF DESCRIPTION OF THE DRAWINGS

To more clearly illustrate technical solutions of embodiments of the present disclosure, the accompanying drawings, which are to be referred by the embodiments of the present invention, will be briefly described. It will be apparent that the accompanying drawings described below illustrate merely some embodiments of the present disclosure. Those skilled in the art will be able to obtain additional drawings in accordance with these drawings without any creative work.

DETAILED DESCRIPTION

In order to better understand technical solutions in the present disclosure, embodiments of the present disclosure will be described in detail below in conjunction with the accompanying drawings.

It will be apparent that the embodiments described below are merely some but not all the embodiments of the present disclosure. All the other embodiments obtained by those skilled in the art without any creative work are within the protective scope as claimed by the claims of the present disclosure.

Terms used in the embodiments of the present disclosure are only for the purpose of describing specific embodiments, but not for limiting the present disclosure. Singular forms such as "a", "an", "the" as used in the embodiments and the attached claims are also intended to include plural forms unless the context clearly indicates other meanings.

Figure 1:
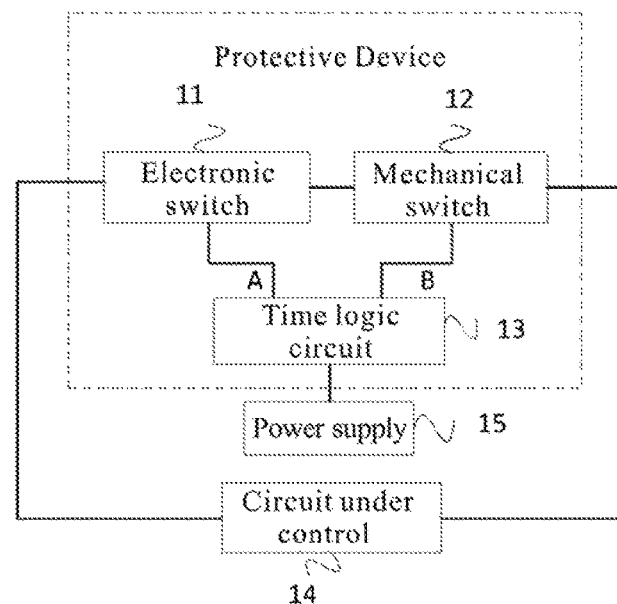
FIG. 1 is a schematic diagram illustrating a composition of a protective device provided in the present disclosure.

The present disclosure provides a protective device to be applied in a battery management system. FIG. 1 is a schematic diagram illustrating a composition of the protective device, which includes an electronic switch 11, a mechanical switch 12 and a time logic circuit 13. A first output terminal A of the time logic circuit 13 may be connected to the electronic switch 11; a second output terminal B of the time logic circuit 13 may be connected to the mechanical switch 12; an input terminal of the time logic circuit 13 may be connected to an output terminal of a power supply 15; and the electronic switch 11 may be connected in series with the mechanical switch 12 into a circuit 14 under control.

In an embodiment, the electronic switch 11 may be a thyristor, a transistor, or an integrated gate commutated thyristor. There is no contact between contact points in the electronic switch 11. Also, there is no electric arc generated when the electronic switch 11 with a load is turned off. However, the electronic switch 11 cannot enable electrical isolation. In the present disclosure, the electronic switch 11 is configured to control whether there is a current flowing through the mechanical switch 12.

In an embodiment, the mechanical switch 12 may be a relay or a contactor. The contactor may be often used in a large current circuit, while the relay may be mainly used in a small current circuit having a current in a range of a few amperes to more than ten amperes. When a charging/discharging circuit of a battery pack is a small current loop, the relay may be typically utilized to control conduction and disconnection of the charging/discharging circuit of the battery pack, so as to enable the electrical isolation and ensure the safety of using the battery.

In an embodiment, the power supply 15 may be used to provide driving signals to the time logic circuit.

With the protective device, when a driving signal is provided to the time logic circuit 13 from the output terminal of the power supply 15, the driving signal may be decomposed into two signals through the time logic circuit, namely a control signal a that is output from the first output terminal A of the time logic circuit and configured to control ON/OFF of the electronic switch 11, and a control signal b that is output from the second output terminal B of the time logic circuit and configured to control ON/OFF of the mechanical switch 12. When the driving signal input to the time logic circuit 13 is a high level signal for controlling a switch to be turned on, the driving signal may be processed by the time logic circuit 13 to produce the control signal a and the control signal b, wherein the control signal b may first be output as a high level signal and then the control signal a may be output as a high level signal after a certain time period of delay. In this way, when the mechanical switch 12 is turned on, the electronic switch 11 is not turned on and thus there is no load current flowing through the mechanical switch 12, thereby avoiding the inrush current at the moment the mechanical switch 12 is turned on. When the driving signal input to the time logic circuit 13 is a low level signal for controlling a switch to be turned off, the driving signal may be processed by the time logic circuit 13 to produce the control signal a and the control signal b, wherein the control signal a may first be output as a low level signal and then the control signal b may be output as a low level signal after a certain time period of delay. In this way, the electronic switch 11 may be first turned off to cut off the load current in the circuit and then the mechanical switch 12 may be turned off, thereby avoiding the electric arc generated between switch contact points when the mechanical switch 12 is turned off.

It is to be noted that the control signal a output from the time logic circuit 13 may be transported via a communication bus for connecting the first output terminal A of the time logic circuit 13 to the electronic switch 11, and the control signal b may be transported via a communication bus for connecting the second output terminal B to the mechanical switch 12. In an embodiment, the communication bus for transporting the control signal may include a Controller Area Network (CAN), a Local Interconnect Network (LIN), and an Ethernet.

The present disclosure provides a protective device. In such a device, the control of the electronic switch 11 may be implemented via a signal output from the first output terminal A of the time logic circuit 13, and the control of the mechanical switch 12 may be implemented via a signal output from the second output terminal B of the time logic circuit 13. In use, the time logic circuit 13 may control the mechanical switch 12 to be turned on first and then the electronic switch 11 to be turned on; when turning off the switches, the time logic circuit 13 may control the electronic switch 11 to be turned off first and then the mechanical switch 12 to be turned off. As a result, it may be ensured that there is no load current flowing through the mechanical switch 12 at the moment the mechanical switch 12 is turned on or turned off, thereby effectively avoiding the contact ablation in the mechanical switch 12 caused by the current in the circuit at the moment the mechanical switch 12 is turned on or turned off and extending the service life of the mechanical switch 12.

Figure 2:
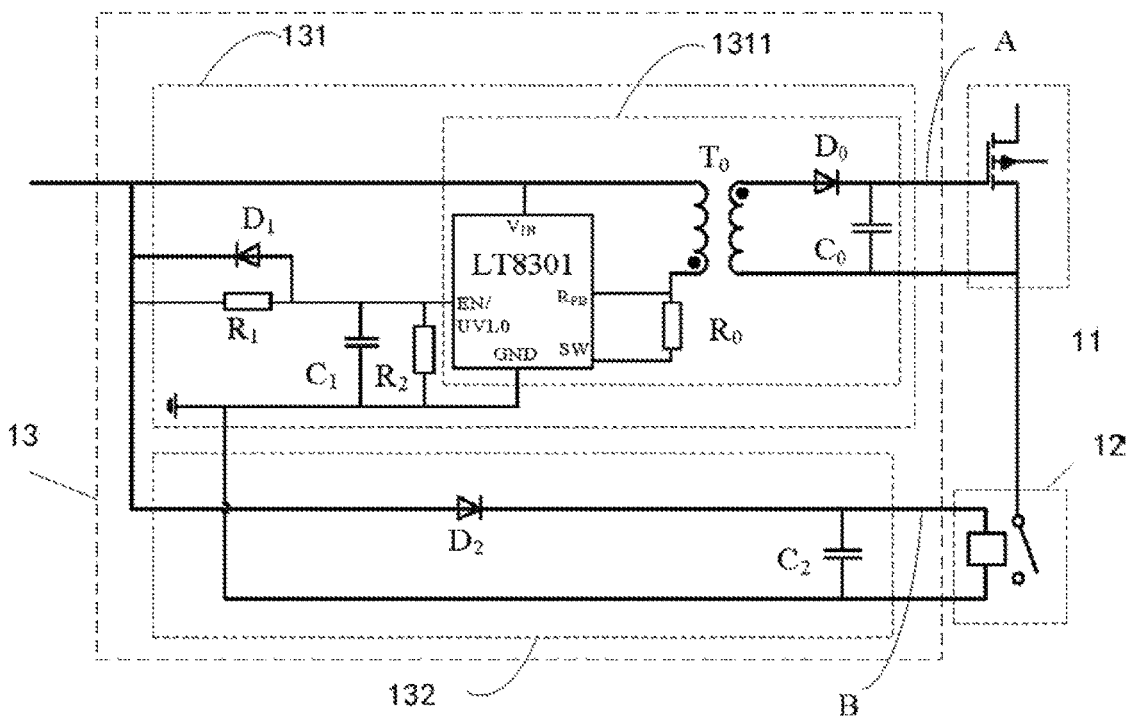
FIG. 2 is a schematic diagram illustrating a composition of a time logic circuit provided in the present disclosure.

Based on the above described control of the electronic switch 11 and the mechanical switch 12, the mechanical switch 12 may be turned on before the electronic switch 11 is turned on, and the electronic switch 11 may be turned off before the mechanical switch 12 is turned off. The present disclosure provides a time logic circuit as shown in FIG. 2. The time logic circuit 13 may include a first drive circuit 131 and a second drive circuit 132.

The first drive circuit 131 may include a first resistor $R_1$, a second resistor $R_2$, a first capacitor $C_1$, a first diode $D_1$ and a flyback circuit 1311.

An end of the first resistor $R_1$ may be connected to the output terminal of the power supply 15, and the other end of the first resistor $R_1$ may be connected to an input terminal of the flyback circuit 1311.

An end of the first diode $D_1$ may be connected to the output terminal of the power supply 15, and the other end of the first diode $D_1$ may be connected to the input terminal of the flyback circuit 1311.

An end of the first capacitor $C_1$ may be connected to the input terminal of the flyback circuit 1311, and the other end of the first capacitor $C_1$ may be grounded.

An end of the second resistor $R_2$ may be connected to the input terminal of the flyback circuit 1311, and the other end of the second resistor $R_2$ may be grounded.

The second drive circuit 132 may include a second capacitor $C_2$ and a second diode $D_2$.

An end of the second diode $D_2$ may be connected to the output terminal of the power supply 15, and the other end of the second diode $D_2$ may be connected to the mechanical switch and an end of the second capacitor $C_2$.

The end of the second capacitor $C_2$ may be connected to the second diode and the mechanical switch, and the other end of the second capacitor $C_2$ may be grounded.

It is to be noted that the flyback circuit may be composed of a LT8301 chip, a resistor $R_0$, a transformer $T_0$, an output rectifier diode $D_0$ and an output filter capacitor $C_0$. The connection of the flyback circuit may be implemented in accordance with existing technology. In particular, a SW pin of the LT8301 chip may be connected to an end of a primary side of the transformer $T_0$ and an end of the resistor $R_0$, and a RFB pin of the LT8301 chip may be connected to the other end of the resistor $R_0$; a ground pin of the LT8301 chip may be grounded, and both a power supply pin VIN of the LT8301 and the other end of the primary side of the transformer $T_0$ may be connected to the power supply 15; an end of a secondary side of the transformer $T_0$ may be connected to an anode of the output rectifier diode $D_0$ and the other end of the secondary side of the transformer $T_0$ may be connected to an end of the output filter capacitor $C_0$, and the other end of the output filter capacitor $C_0$ may be connected to a cathode of the output rectifier diode $D_0$ as both the output terminal of the flyback circuit and the first output terminal A of the time logic circuit; an enable pin EN/UVL0 of the LT8301 may act as the input terminal of the flyback circuit.

It is also to be noted that the ground in the above time logic circuit indicates a signal ground which means a reference point of zero potential. Accordingly, the above described connection with the ground is essentially a connection with a common terminal for forming a circuit loop.

The operation of the time logic circuit 13 will be described below in conjunction with both procedures of controlling the electronic switch 11 and the mechanical switch 12 to be turned on and turned off.

Figure 2A:
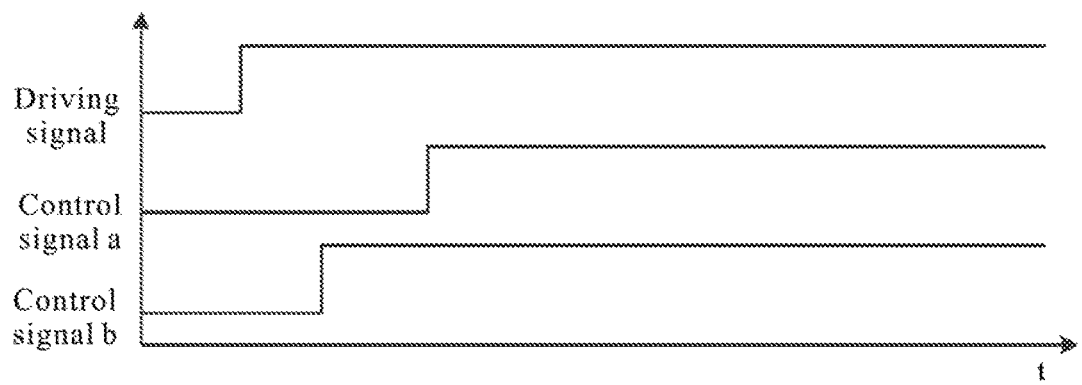
FIG. 2A is a time sequence diagram of an output of a time logic circuit provided in the present disclosure.

(1) The procedure of controlling the electronic switch 11 and the mechanical switch 12 to be turned on. FIG. 2A is a time sequence diagram of the input driving signal and the output signal of the time logic circuit 13 during the procedure.

When a high level driving signal is input to the input terminal of the time logic circuit 13, the high level driving signal may charge the first capacitor $C_1$ via the first resistor $R_1$ of the first drive circuit 131. Once the voltage across the first capacitor $C_1$ reaches a turn-on voltage of the flyback circuit, the LT8301 may start to operate, and a high level control signal a may be output from the output terminal (i.e. the first output terminal A of the time logic circuit 13) of the flyback circuit 1311 to control the electronic switch 11 to be turned on. Meanwhile, the high level driving signal may also charge the second capacitor $C_2$ via the second diode $D_2$ of the second drive circuit 132. Once the voltage across the second capacitor $C_2$ reaches an operating voltage of the mechanical switch 12, a high level control signal b may be output from the second output terminal B of the time logic circuit 13 to control the mechanical switch 12 to be turned on. Due to the voltage division by the second resistor $R_2$ and the first resistor $R_1$, a charging time of the first capacitor $C_1$ may be longer than a charging time of the second capacitor $C_2$. Thus, the second drive circuit 132 may output the control signal b first, and then the first drive circuit 131 may output the control signal a after a time period of delay. Here, the time sequence diagram of the input driving signal and the output signal of the time logic circuit 13 is illustrated in FIG. 2A.

Figure 2B:
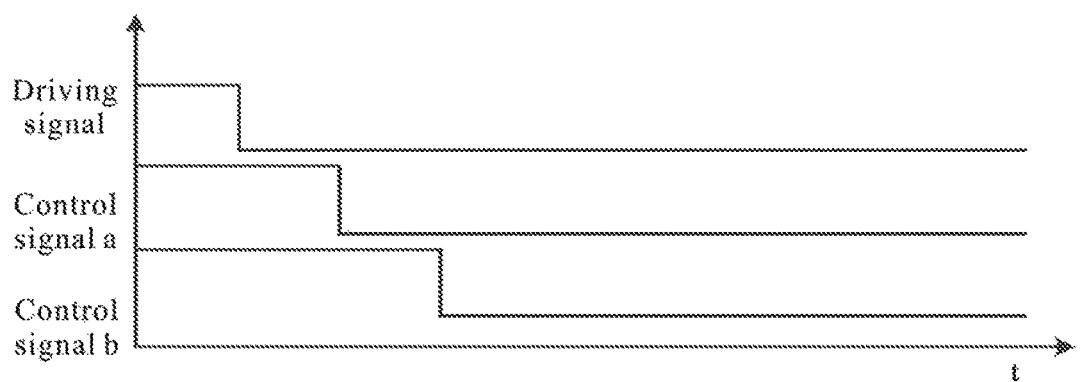
FIG. 2B is a time sequence diagram of an output of another time logic circuit provided in the present disclosure.

(2) The procedure of controlling the electronic switch 11 and the mechanical switch 12 to be turned off. FIG. 2B is a time sequence diagram of the time logic circuit 13 during the procedure.

When a low level driving signal is input to the time logic circuit 13, the first capacitor $C_1$ in the first drive circuit 131 may be rapidly discharged via the first diode $D_1$, so that the voltage output from the first capacitor $C_1$ may drop rapidly and then the input voltage at the enable pin of the LT8301 may be rapidly reduced to make the LT8301 stop working. A low level control signal a may be output from the output terminal (i.e. the first output terminal A of the first drive circuit 131) of the flyback circuit 1311 to control the electronic switch 11 to be turned off. Since the second capacitor $C_2$ in the second drive circuit 132 has a large capacitance and the second diode $D_2$ has unidirectional conductivity, the second capacitor $C_2$ can only be discharged via the connected mechanical switch 12, which ensures that the second capacitor $C_2$ is discharged for a long time and the voltage drops slowly. Therefore, the low level control signal b output from the second drive circuit 132 may be delayed as compared to the low level control signal a output from the first drive circuit 131, and thus the electronic switch 11 may be turned off first and then the mechanical switch 12 may be turned off after a time period of delay.

It will be apparent that the embodiments described below are merely some but not all the embodiments of the present disclosure. All the other embodiments obtained by those skilled in the art without any creative work are within the protective scope as claimed by the claims of the present disclosure.

The above description only provides some preferred embodiments of the present disclosure and is not intended to limit the present disclosure. Any modifications, equivalents, and improvements without departing from the spirit and principles of the present disclosure should be included within the scope of the present disclosure.

What is claimed is:

1. A protective device, comprising an electronic switch, a mechanical switch and a time logic circuit, wherein:

a first output terminal of the time logic circuit is connected to the electronic switch;
a second output terminal of the time logic circuit is connected to the mechanical switch;
an input terminal of the time logic circuit is connected to an output terminal of a power supply; and
the electronic switch is connected in series with the mechanical switch into a circuit under control,
wherein the time logic circuit comprises a first drive circuit and a second drive circuit;
the first drive circuit comprises a first resistor, a second resistor, a first capacitor, a first diode and a flyback circuit, wherein:
an end of the first resistor is connected to the output terminal of the power supply, and the other end of the first resistor is connected to an input terminal of the flyback circuit;
an end of the first diode is connected to the output terminal of the power supply, and the other end of the first diode is connected to the input terminal of the flyback circuit;
an end of the first capacitor is connected to the input terminal of the flyback circuit, and the other end of the first capacitor is grounded; and
an end of the second resistor is connected to the input terminal of the flyback circuit, and the other end of the second resistor is grounded;
the second drive circuit comprises a second capacitor and a second diode, wherein:
an end of the second diode is connected to the output terminal of the power supply, and the other end of the second diode is connected to the mechanical switch and an end of the second capacitor; and
the end of the second capacitor is connected to the second diode and the mechanical switch, and the other end of the second capacitor is grounded.

2. The device of claim 1, wherein a charging time of the first capacitor is longer than a charging time of the second capacitor.

3. The device of claim 1, wherein the electronic switch comprises a thyristor, a transistor, or an integrated gate commutated thyristor.

4. The device of claim 1, wherein the mechanical switch comprises a relay or a contactor.

5. The device of claim 1, wherein the connection between the first output terminal of the time logic circuit and the electronic switch and the connection between the second output terminal of the time logic circuit and the mechanical switch are implemented via a communication bus.

6. The device of claim 5, wherein the communication bus comprises a Controller Area Network (CAN), a Local Interconnect Network (LIN), and an Ethernet.

* * * * *